(12) United States Patent
Alpert et al.

(10) Patent No.: US 7,073,144 B2
(45) Date of Patent: Jul. 4, 2006

(54) STABILITY METRICS FOR PLACEMENT TO QUANTIFY THE STABILITY OF PLACEMENT ALGORITHMS

(75) Inventors: Charles Jay Alpert, Round Rock, TX (US); Gi-Joon Nam, Austin, TX (US); Paul Gerard Villarrubia, Austin, TX (US); Mehmet Can Yildiz, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 10/825,148

(22) Filed: Apr. 15, 2004

(65) Prior Publication Data

US 2005/0235237 A1  Oct. 20, 2005

(51) Int. Cl.
*G06F 17/50* (2006.01)
(52) U.S. Cl. ............................ 716/5; 716/8
(58) Field of Classification Search ............. 716/8–10, 716/5
See application file for complete search history.

(56) References Cited

U.S. PATENT DOCUMENTS

| | | | | |
|---|---|---|---|---|
| 5,903,461 A | * | 5/1999 | Rostoker et al. ............ 700/121 |
| 2002/0157075 A1 | * | 10/2002 | Teig et al. .................... 716/10 |
| 2003/0121015 A1 | * | 6/2003 | Teig et al. ..................... 716/7 |
| 2005/0028122 A1 | * | 2/2005 | Fallon et al. ................. 716/10 |
| 2005/0086622 A1 | * | 4/2005 | Alpert et al. .................. 716/9 |
| 2005/0166164 A1 | * | 7/2005 | Ren et al. ...................... 716/2 |

* cited by examiner

*Primary Examiner*—Stacy A. Whitmore
(74) *Attorney, Agent, or Firm*—Casimer K. Salys; Jack V. Musgrove

(57) ABSTRACT

A method of assessing the stability of a placement tool used in designing the physical layout of an integrated circuit chip, by constructing different layouts of cells using the placement tool with different sets of input parameters, and calculating a stability value based on the movement of respective cell locations between the layouts. The stability value can be normalized based on cell locations in a random placement. One stability metric measures absolute movement of individual cells in the layouts, weighted by cell area. The cell movements can be squared in calculating the stability value. Another stability metric measures the relative movement of cells with respect to their nets. Shifting of cells and symmetric reversal of cells about a net center does not contribute to this relative movement, but spreading of cells and rotation of cells with respect to the net center does contribute to the relative movement. Relative cell movements can again be squared in calculating the stability value. Many different layouts can be designed using the same placement tool with a range of different input parameters and different movement metrics to build a collection of comparative values that can be used to identify stability characteristics for that tool.

27 Claims, 5 Drawing Sheets

STABILITY METRICS FOR PLACEMENT TO QUANTIFY THE STABILITY OF PLACEMENT ALGORITHMS

BACKGROUND OF THE INVENTION

1. Field of the Invention

The present invention generally relates to the fabrication and design of semiconductor chips and integrated circuits, and more specifically to a method of evaluating computer-aided design (CAD) tools used in mapping the physical layout and wiring of logic cells in an integrated circuit.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cells types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. An electronic design automation (EDA) system typically receives one or more high level behavioral descriptions of an IC device (e.g., in HDL languages like VHDL, Verilog, etc.), and translates this high level design language description into netlists of various levels of abstraction. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photo-lithographic steps.

The process of converting the specifications of an electrical circuit into the arrangement which is formed on the chip is called the physical design, which includes both the layout (placement) and wiring (routing) of cells. Cell placement in semiconductor fabrication involves a determination of where particular cells should optimally (or near-optimally) be located on the surface of a integrated circuit device. Due to the large number of components and the details required by the fabrication process, physical design is not practical without the aid of computers. As a result, most phases of physical design extensively use computer aided design (CAD) tools, and many phases have already been partially or fully automated. Automation of the physical design process has increased the level of integration, reduced turn around time and enhanced chip performance.

Placement algorithms are typically based on either a simulated annealing, cut-based partitioning, or analytical paradigm (or some combination thereof). Recent years have seen the emergence of several new academic placement tools, especially in the top-down partitioning and analytical domains. The advent of multilevel partitioning as a fast and extremely effective algorithm for min-cut partitioning has helped spawn a new generation of top-down cut-based placers. A placer in this class partitions the cells into either two (bisection) or four (quadrisection) regions of the chip, then recursively partitions each region until a global coarse placement is achieved. Such recursive cut-based placement can perform quite well when designs are dense, but they perform rather poorly when the designs are sparse. Sparse designs tend to fool the partitioner since it does not know how to handle the large flexibility in the balance tolerance.

Simulated annealing approaches try making moves of randomly chosen cells and accepting each move based on a probabilistic function. Annealing typically produces excellent results though it requires high runtime.

Analytical placers typically solve a relaxed placement formulation (such as minimizing total quadratic wirelength) optimally, based on relaxed constraints which allow cells to temporarily overlap. Legalization is achieved by removing overlaps via either partitioning or by introducing additional forces and/or constraints to generate a new optimization problem. The classic analytical placers, PROUD and GORDIAN, both iteratively use bipartitioning techniques to remove overlaps.

FIGS. 1A–1C illustrate a typical placement process according to the prior art. First, a plurality of the logic cells 2 are placed using the entire available region of the IC 4 as shown in FIG. 1A. After initial placement, the chip is partitioned, in this case, via quadrisection, to create four new regions. At the beginning of the partitioning phase some cells may overlap the partition boundaries as seen in FIG. 1B. The cell locations are then readjusted to assign each cell to a given region as shown in FIG. 1C. The process then repeats iteratively for each region, until the number of cells in a given region reaches some preassigned value, e.g., one. While FIGS. 1A–1C illustrate the placement of only seven cells, the number of cells in a typical IC can be in the hundreds of thousands, and there may be dozens of iterations of placement and partitioning.

Placement helps to identify needed changes in the logic, required buffering, gate sizing, routing congestion, etc. Once these problems are fixed, the placement process may have to be run again on the adjusted design. Ideally, after each subsequent placement run, the problems that were fixed the last time stay fixed, and new problems do not crop up. To achieve timing closure, one often has to run through several iterations of physical synthesis flows, for which placement is a critical step. During these iterations, one hopes to consistently move towards design convergence. However, if a placement algorithm returns a radically different solution than it did the previous time, entirely new problems could emerge.

It is thus paramount that a placement algorithm not only return a high quality solution, but also be stable, returning similar solutions even for slightly different inputs and/or constraints. The stability of the algorithm is arguably as important a characteristic as the wirelength it achieves. However, there is currently no way to quantify the stability of a placement algorithm. It would, therefore, be desirable to devise metrics that measure the stability of a placement algorithm. It would be further advantageous if the metrics could convincingly illustrate that some algorithms are quantifiably more stable than others in terms of their effectiveness for achieving timing closure.

SUMMARY OF THE INVENTION

It is therefore one object of the present invention to provide a method of assessing the stability of techniques or algorithms (i.e., CAD tools) used for placement of logic cells in the physical design of an integrated circuit chip.

It is another object of the present invention to provide a method of quantitatively defining the stability of a placement system to enable reliable comparisons between different placement systems.

It is yet another object of the present invention to provide stability metrics which can be used to identify properties of certain designs that make one algorithm more stable than another.

The foregoing objects are achieved in a method of evaluating the stability of a placement tool used in mapping the physical layout of logic cells of an integrated circuit chip, generally comprising the steps of designing a first layout of cells using the placement tool based on a first set of input parameters, designing a second layout of cells using the same placement tool based on a second set of input parameters which is different from the first set of input parameters, and then calculating a stability value based on the movement of respective cell locations from the first layout to the second layout. The stability value is preferably normalized based on respective cell locations in a third layout which is a random placement of the cells. One stability metric measures the absolute movement of individual cells in the layouts, weighted by cell area. The cell movements can alternatively be squared in calculating the stability value. Another stability metric measures the relative movement of cells with respect to one or more nets in the layouts. Shifting of cells and symmetric reversal of cells about a net center does not contribute to this relative movement, but spreading of cells and rotation of cells with respect to the net center does contribute to the relative movement. The relative cell movements can again be squared in calculating the stability value.

The differences in the layouts arise from differences in the input parameters, which vary depending upon the type of placement tool used. For example, if the placement tool uses an annealing algorithm, then the annealing schedules might be adjusted. If the placement tool uses a multi-level algorithm, different random seeds can be used for clustering. If the placement tool uses a quadratic algorithm, different stopping criteria can be used. Many different layouts can be designed using the same placement tool with a range of different input parameters and different movement metrics to build a collection of comparative values that can be used to identify stability trends for that tool.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1A:
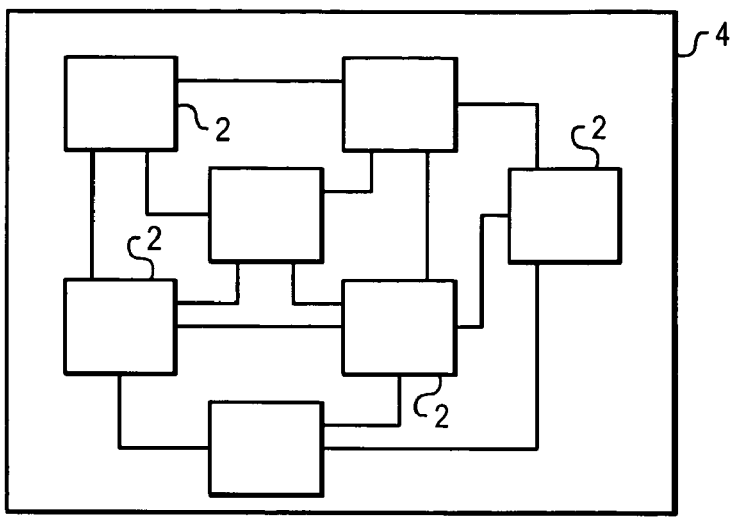
FIGS. 1A–1C are plan views of an integrated circuit chip, illustrating a typical prior art placement and partitioning process for laying out the design of an integrated circuit.
Figure 1B:
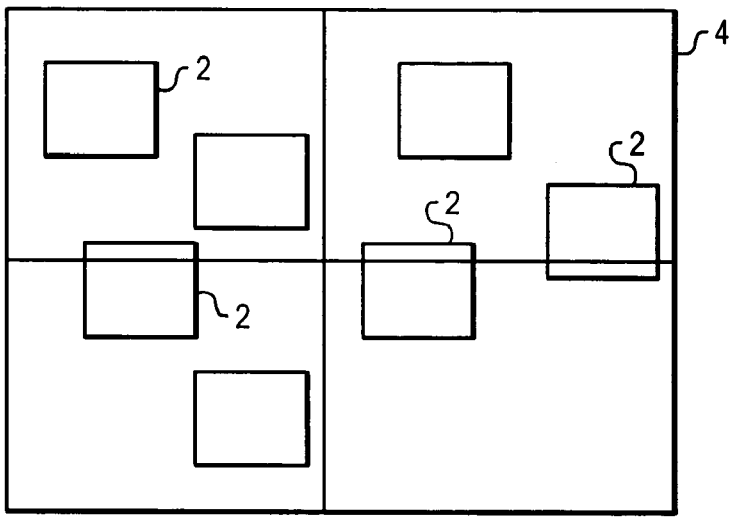
Figure 1C:
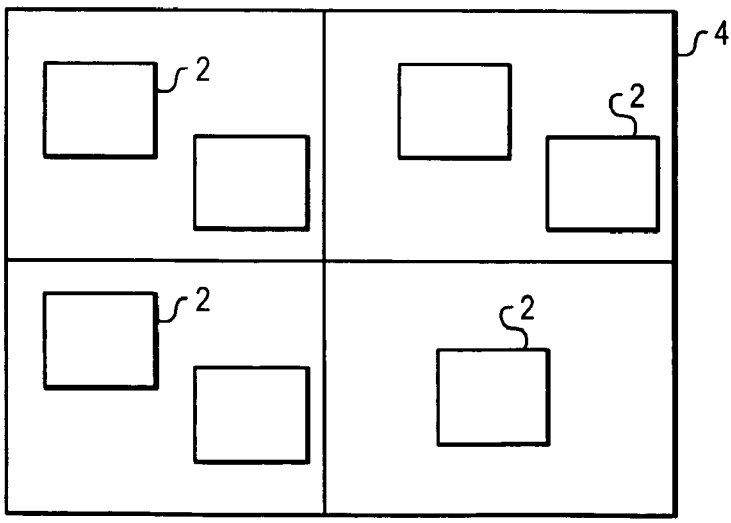
Figure 2:
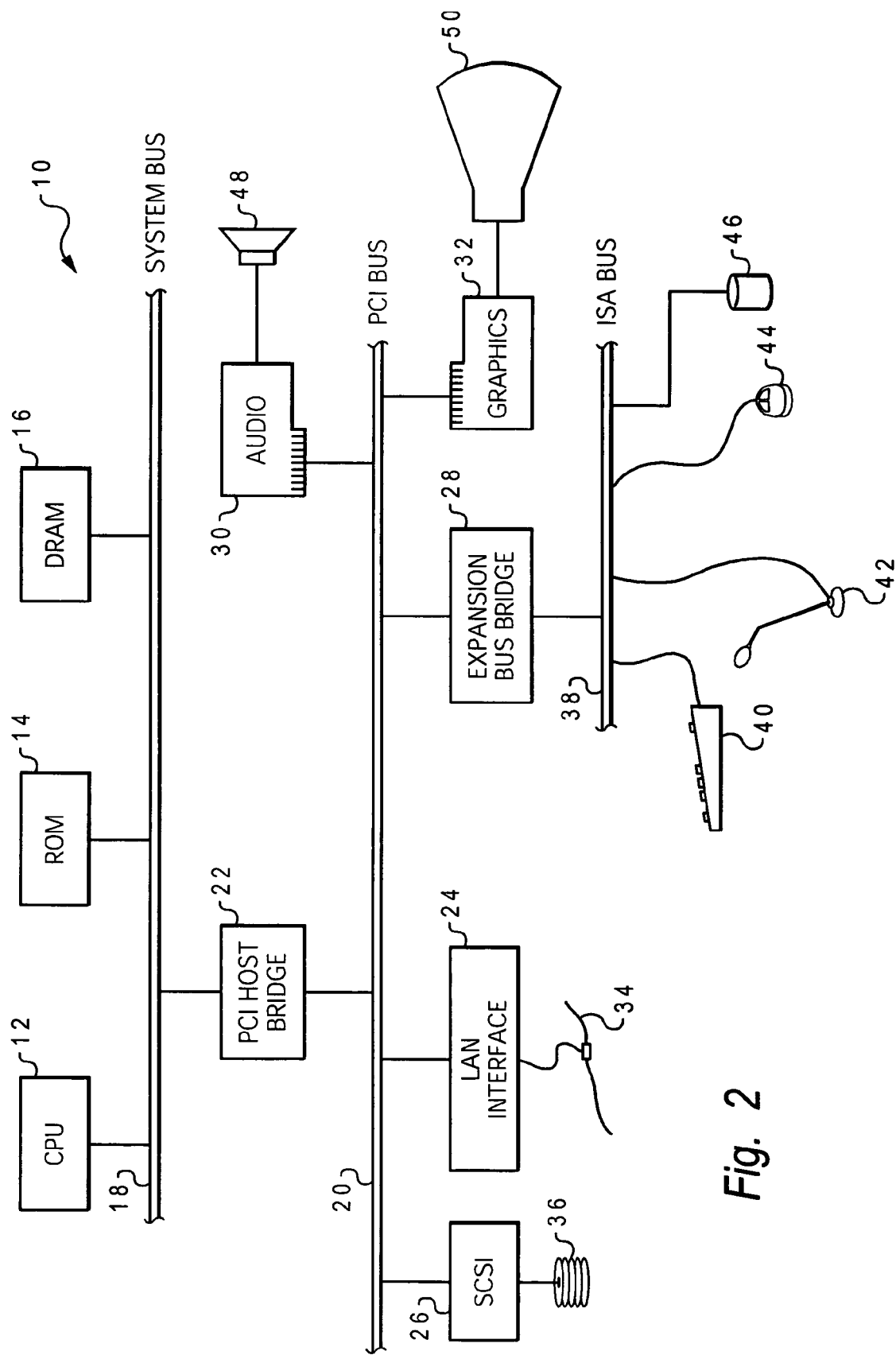
FIG. 2 is a block diagram of a computer system programmed to carry out the evaluation of computer-aided design of an integrated circuit in accordance with one implementation of the present invention.

The present invention provides a method for assessing the stability of computer-aided design (CAD) tools used in mapping the physical layout (placement) and wiring (routing) of logic cells for the design of an integrated circuit chip. The invention quantifies the stability of these tools using numeric computations, as explained further below, which are carried out on a data processing system or computer. FIG. 2 depicts one embodiment 10 of a computer system programmed to carry out evaluation of an industrial placement tool in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to control the stability evaluation process as taught herein.

While the illustrative implementation provides the program instructions embodying the present invention on disk drive 36, those skilled in the art will appreciate that the invention can be embodied in a program product utilizing other computer-readable media, including transmission media.

Computer system 10 carries out program instructions for evaluating the stability of a placement tool utilized in the design of an integrated circuit, in accordance with one or more of the implementations discussed in detail below. Accordingly, practice of the invention includes the execution of the conventional placement tools to be evaluated. The details of those tools are beyond the scope of the present but will become apparent to those skilled in the art upon reference to this disclosure. Operation of those placement tools can be carried out by computer system 10 as well.

In the exemplary embodiment, computer system 10 is programmed to generate a stability value for a placement tool based on the movement of individual logic cells or the movement of cell clusters (nets) between two or more different placement layouts which correspond to slightly different placement inputs. By measuring the physical movement of cells between the two designs, the differences between the layouts become quantifiable. A placement algorithm that is "stable" will consistently drive towards similar solutions, even with changes in the input netlist and placement parameters, and so will have only small cell movements given minor changes to the inputs. For example, in a simulated annealing algorithm one could vary the annealing schedules or runtime criteria. A multi-level algorithm could vary number of iterations or use different random seeds for clustering. A quadratic algorithm could vary the stopping criteria for its analytical solver.

Figure 3C:
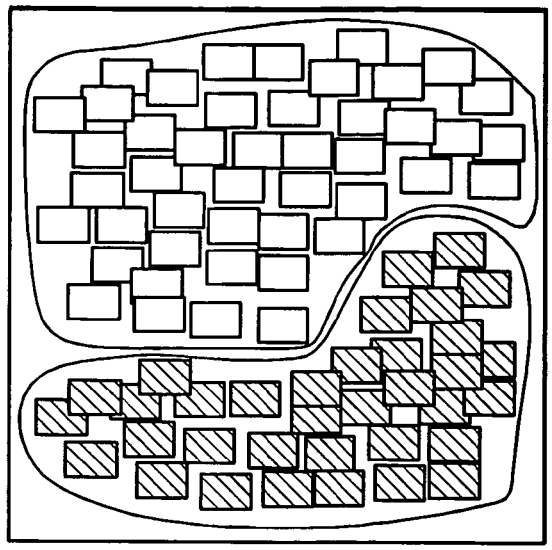
FIGS. 3A–3C are simplified plan views of different placements of logic cells which can be compared in accordance with various implementations of the present invention to determine the stability of a placement tool by examining cell movement between the different placements, with FIG. 3A depicting a placement structure having two nets, FIG. 3B depicting a random placement, and FIG. 3C depicting a generally symmetrical layout (mirror image) of the layout shown in FIG. 3A.
Figure 3B:
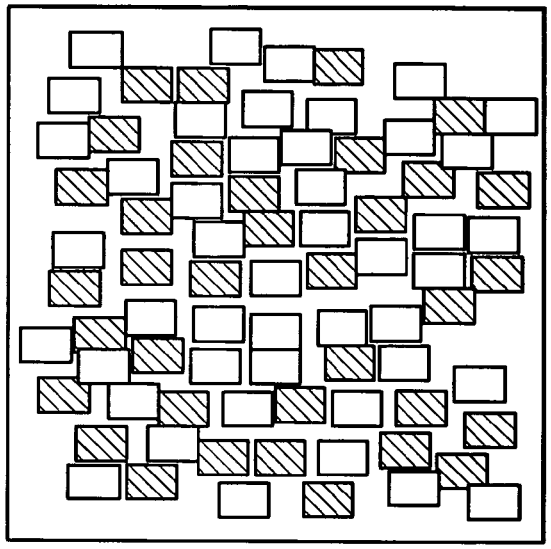
Figure 3A:
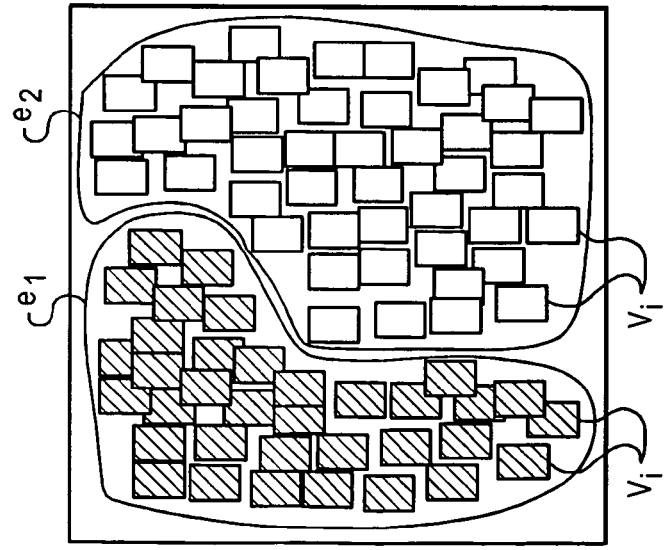
Figure 4A:
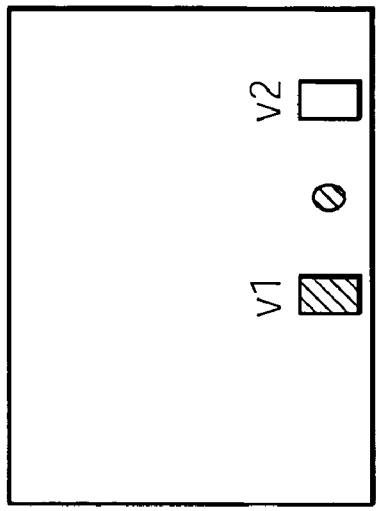
FIGS. 4A–4D are simplified plan views of 2-pin nets with FIG. 4A depicting an initial placement structure with two cells, FIG. 4B depicting a shifting and reversing of the two cells, FIG. 4C depicting a spreading of the two cells, and FIG. 4D depicting a rotation of the two cells.
Figure 4B:
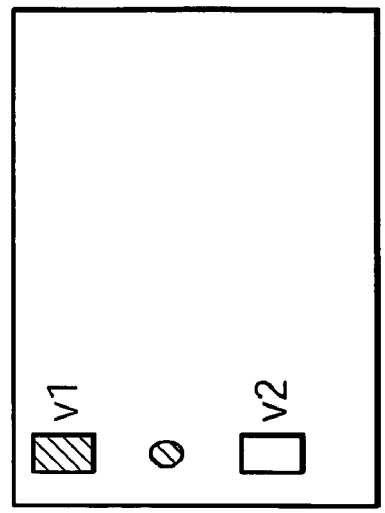
Figure 4C:
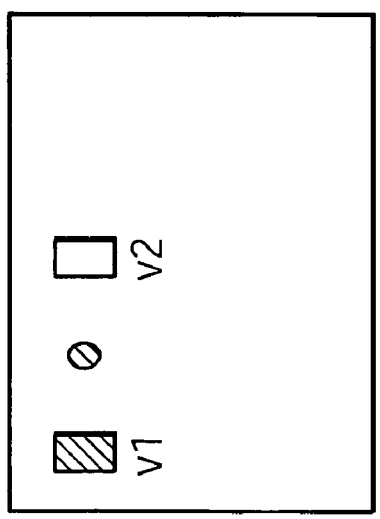
Figure 4D:
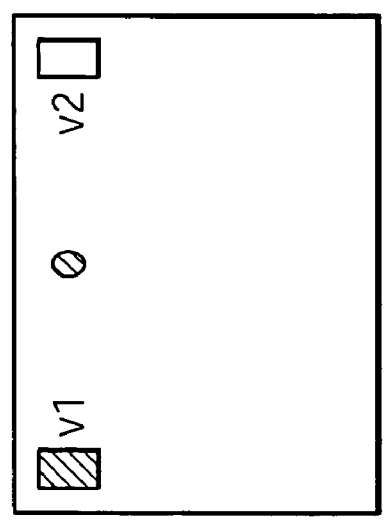

With reference to FIG. 3A, the placement problem can be defined in terms of a circuit netlist G=(V,E) consisting of n cells $\{v_1, v_2, \ldots, v_n\}$ and m nets $E=(e_1, e_2, \ldots, e_m)$, and a rectangular region with width W and height H. A placement is an assignment of each cell $v_i$ to a location $(x_i, y_i)$ in the region such that cells are non-overlapping (conventional placers typically employ a wirelength-based objective, although good placers are also timing-driven and can sacrifice wirelength for routability). In a first implementation of the present invention, the differences between two placements are quantified by the changes in the respective locations of the individual cells $v_i$ from one placement to the next. When a larger cell moves, this can have more impact on the placement than the movement of a smaller cell, so the total cell movement can be weighted by area. If a given cell $v_i$ has an area $a_i$, so the total area of all cells is $A_t = a_1 + a_2 + \ldots + a_n$, and $(x^A_i, y^A_i)$ is the location of cell $v_i$ in placement A, then the total object movement OM of cells in terms of Manhatten distance can be expressed as $$OM(A, B) = \Sigma a_i(|x^A_i - x^B_i| + |y^A_i - y^B_i|).$$

This value has no sense of scalability. To render it a more useful stability metric, it can be scaled or normalized. One approach to normalizing is by comparison to a random placement such as that shown in FIG. 3B, so that its expected value is one when A and B are both random. It can be shown that the expected Manhattan distance between two random points in the W×H plane is (W+H)/3. Thus, for a random placement, the expected value of OM becomes $$OM(A, B)_{random} = \Sigma a_i(W/3 + H/3) = [A_t(W+H)]/3.$$

Dividing this normalization factor into the original equation for object movement yields the stability metric $S_{OM}$ $$S_{OM}(A, B) = [3\Sigma a_i(|x^A_i - x^B_i| + |y^A_i - y^B_i|)]/[A_t(W+H)].$$

This metric measures the linear movement between cells. While this stability metric is very useful, the designer might place a higher penalty on objects that move a far distance in the placement. This concern can be incorporated into the stability metric by measuring the squared object movement OMS (keeping the horizontal and vertical separate as is the practice in analytical placement)

$$OMS(A, B) = \Sigma a_i((x^A_i - x^B_i)^2 + (y^A_i - y^B_i)^2).$$

The squared movement can again be normalized by comparison to random placement. It can be shown that the expected squared Euclidean distance between two random points in the plane W×H plane is $(W^2 + H^2)/6$. Thus, for a random placement, the expected value of OMS becomes $$OMS(A, B)_{random} = [A_t(W^2 + H^2)]/6.$$

Dividing this normalization factor into the original equation for squared object movement yields the stability metric $S_{OMS}$ $$S_{OMS}(A, B) = [6\Sigma a_i((x^A_i - x^B_i)^2 + (y^A_i - y^B_i)^2)]/[A_t(W^2 + H^2)].$$

These two metrics measure the movement of individual cells, but do not take into consideration the nets or structure of the placement. In the example shown in FIG. 3A, the placement has a natural structure in which there are two dominant clusters of logic $e_1, e_2$. The placement in FIG. 3C is the mirror-image of the placement in FIG. 3A. According to the foregoing stability metrics, it is likely that the normalized stability value based on a comparison of the placements in FIGS. 3A and 3C would be greater than one, since the average cell location moves significantly between the two placements. However, the two placements still have great structural similarity, especially when compared to the random placement. Both FIG. 3A and FIG. 3B preserve the natural connectivity-based clustering of cells. It is therefore useful to define an alternate stability metric which quantifies how well the cells connected to each net stay grouped together from one placement to the next.

A given cell can be considered a part of a net if it has at least one pin that is connected to the net. A net is an interconnection between pins of two or more cells. If $n_j$ denotes the number of pins connected to a given net $e_j$, the coordinates $(x_{cj}, y_{cj})$ of the center of the net can be expressed as $$x_{cj} = \Sigma x_i/n_j \text{ and } y_{cj} = \Sigma y_i/n_j \text{ (summed over all cells } v_i \text{ in the net)}.$$

This net center provides a basis for measuring net movement in an alternative implementation of the present invention. For this set of net center metrics, the absolute movement of cells or nets is not relevant. Instead, the movement of cells is measured relative to the nets to which they are connected.

The average difference of the horizontal distance of the pins of net $e_j$ to the center of the net between placement A and placement B can be expressed as $$HD_j(A, B) = (1/n_j)\Sigma ||x^A_i - x^A_{cj}| - |x^B_i - x^B_{cj}||.$$

In other words, this average distance is the sum of the cumulative differences from each point to its net center, divided by the number of pins connected to the net. Similarly, the average difference of the vertical distance of the pins to the center of the net can be expressed as $$VD_j(A, B)=(1/n_j)\Sigma||y^A_i-y^A_{cj}|-|y^B_i-y^B_{cj}||.$$

FIGS. 4A–4D illustrate various interpretations of these quantities in a simplified net structure. Two cells $v_1$ and $v_2$ are connected to a 2-pin net in an initial placement A shown in FIG. 4A. The net center is always the midpoint of these cells, as indicated by a black dot. In a different placement B shown in FIG. 4B, the cells have been translationally shifted downward and to the right and the cell order has been reversed, but their horizontal span remains the same. Hence $HD_j(A, B)=0$. This shifting and flipping does not contribute to the net center metric. However, a spreading of the cells in another different placement C shown in FIG. 4C does contribute to the net center metric, as the distance from each cell to its net center is larger than before. In the case of a further different placement D shown in FIG. 4D where the net is rotated 90°, $HD_j(A, D)=VD_j(A, D)=|x^A_1-x^A_2|$. Thus, the use of separate horizontal and vertical measures in a net center metric results in rotation affecting the stability value. This is a design choice, but a rotation of the layout is usually considered very different from translation or flipping, in that vertical routing and placement constraints can be quite different from horizontal ones (e.g., in row-based placement). The total net center displacement over all nets can then be defined as $$NC(A, B)=\Sigma n_j(HD_j(A, B)+VD_j(A, B)).$$

To normalize this function for a stability metric, one can use the expected value of the net center displacement $E[NC(A, B)]$. It can be shown that, for a 2-pin net, $E[HD(A, B)]=2W/15$; however, as the number of pins grows $(n_j \to \infty)$, $E[HD(A, B)]=W/6$. A table lookup can be used to provide the proportionality constant $K(n_j)=W/E[HD(A, B)]$. Empirically-derived values for this constant are listed in Table 1 below.

TABLE 1

| size n | K(n) | $K_S$(n) |
|---|---|---|
| 2 | 7.50 | 20.00 |
| 3 | 6.66 | 15.24 |
| 4 | 6.39 | 13.89 |
| 5 | 6.27 | 13.27 |
| 6 | 6.20 | 12.94 |
| 7 | 6.16 | 12.72 |
| 8 | 6.12 | 12.58 |
| 9 | 6.10 | 12.48 |
| 10 | 6.08 | 12.40 |
| 12 | 6.07 | 12.30 |
| 14 | 6.05 | 12.23 |
| 16 | 6.04 | 12.19 |
| 18 | 6.03 | 12.15 |
| 20 | 6.03 | 12.13 |
| 30 | 6.02 | 12.07 |
| 40 | 6.02 | 12.06 |
| 60 | 6.01 | 12.03 |
| 80 | 6.00 | 12.01 |
| 100 | 6.00 | 12.00 |
| >100 | 6.00 | 12.00 |

The expected value of the net center displacement can then be expressed as $$E[NC(A, B)]=\Sigma n_j(W/K(n_j)+H/K(n_j))=P(W+H)/K(n_j),$$

where P is the total number of pins in the netlist, and the normalized net center metric then becomes $$S_{NC}(A, B)=K(n_j)\cdot NC(A, B)/[P(W+H)].$$

As with the object movement metric, a designer may also perceive that the square of the movement relative to the net center more accurately reflects the effect of distance variations in the placements on stability. The horizontal net squared displacement can be expressed as $$HDS_j(A, B)=(1/n_j)\Sigma|(x^A_i-x^A_{cj})^2-(x^B_i-x^B_{cj})^2|,$$

and $VDS_j(A, B)$ can be defined similarly for the vertical net squared displacement. The total net center squared displacement is then $$NCS(A, B)=\Sigma n_j(HDS_j(A, B)+VDS_j(A, B)),$$

and the squared center metric becomes $$S_{NCS}(A, B)=K_S(n_j)\cdot NCS(A, B)/[P(W^2+H^2)],$$

where the constant coefficients $K_S(n_j)$ are also shown in Table 1. By construction, both the NC and NCS metrics yield an expected value of one on random placements.

The foregoing stability metrics were used in simulations on three different placement algorithms in order to understand how these algorithms compare in terms of stability. Each of these three algorithms was written within an industrial placement tool and tested on real designs with up to two million gates. The first tool was a two-way top-down placer, the second tool was an analytical placer that performs 4-way partitioning, and the third tool was a hybrid technique that uses analytical solutions to set constraints for a multilevel partitioner. These experiments revealed that the stability metrics show remarkable consistency for the three algorithms over a set of seven typical industrial designs. Further, it is possible to identify properties of certain designs that make one algorithm more stable than another.

In the simulations, target density was chosen as the input parameter which was varied for the different placements since it applied across all three algorithms. The target density specifies the allowable density within any rectangular region of the placement. A value of 100% allows the algorithm to pack cells in as tightly as possible, which typically minimizes wirelength. However, this invariably cause routing congestion and cripples the ability of physical synthesis to perform optimizations like gate sizing and buffer insertion. The smaller the target density, the more white space is forced to be injected into each rectangular region. Designs typically run with target densities ranging from 50% to 70%. For the test cases, each algorithm was executed 11 times with target densities varying from 60% to 70% in 1% increments.

Several general observations were made from the results, including the following. The square metrics tend to yield smaller values than the linear metrics, even though their expected values are the same. The range of values for the net center metrics are much smaller than the object movement metrics. This effect may be due to the fact that placement algorithms do tend to preserve structure even if the cells themselves move all over the place. It also appears that the third tool (hybrid) was the least stable of the three algorithms. This result can be understood by examining the manner in which that tool sets a particular balance constraint for multilevel partitioning. The balance constraint can vary considerably depending upon the target density. Finally, the first tool (top-down placer) was more stable than the second tool (analytical placer) for designs having a lower ratio of fixed pins to moveable pins, but for designs with a higher ratio the second tool was more stable. More fixed pins causes the analytical solver to consistently generate similar solutions since they have a stabilizing effect as the input parameters change.

Figure 5:
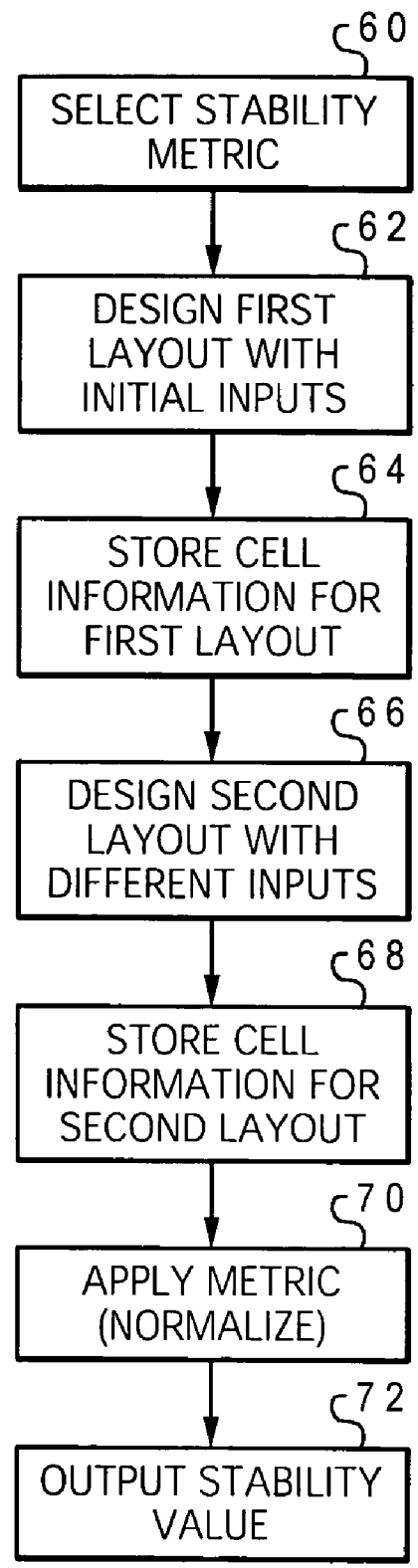
FIG. 5 is a chart illustrating the logical flow according to one implementation of the present invention.

The present invention may be further understood with reference to the chart of FIG. 5 which illustrates the logical flow according to a generalized implementation. The process begins with the designer selecting one of the stability metrics (OM, OMS, NC, NCS) to apply to a placement tool (60). A first set of input parameters is used to construct a first design layout using the placement tool (62). Cell information for the first layout (individual cell locations, nets and cell areas) is stored for later processing (64). A second set of input parameters is used to construct a second design layout using the same placement tool (66), and that cell information is stored as well (68). The selected metric is then applied to the 2 sets of placement data to calculate cell movement (70). This step can include normalization of the measured stability. The normalized stability value is output to the designer or otherwise recorded for subsequent analysis (72). These steps can be repeated for the same placement tool using different input parameters or different movement metrics to build a collection of values that can be used to identify stability trends for that tool.

The stability metrics as disclosed herein effectively quantify the stability of placement algorithms. In particular, the scaled metrics allow a designer to measure algorithm stability across a range of different designs and still intuitively understand the behavior.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while only four movement metrics are specifically disclosed, there are other techniques for measuring cell movement which can be used to quantify placement stability. It is therefore contemplated that such modifications can be made without departing from the spirit or scope of the present invention as defined in the appended claims.

What is claimed is:

1. A method of quantifying the stability of a placement tool used in mapping the physical layout of logic cells for an integrated circuit chip, comprising the steps of:
designing a first layout of logic cells using the placement tool based on a first set of input parameters;
designing a second layout of the logic cells using the placement tool based on a second set of input parameters which is different from the first set of input parameters;
calculating a stability value based on the movement of respective cell locations from the first layout to the second layout; and
normalizing the stability value based on respective cell locations in a third layout which is a random placement of the logic cells.

2. The method of claim 1 wherein said calculating step measures absolute movement of individual logic cells.

3. The method of claim 2 wherein cell movement is weighted by cell area in calculating the stability value.

4. The method of claim 2 wherein absolute cell movement is squared in calculating the stability value.

5. The method of claim 1 wherein said calculating step measures relative movement of logic cells with respect to the one or more nets of the layouts.

6. The method of claim 5 wherein shifting of logic cells and symmetric reversal of logic cells about a net center does not contribute to the relative movement, but spreading of logic cells and rotation of logic cells with respect to the net center does contribute to the relative movement.

7. The method of claim 5 wherein relative cell movement is squared in calculating the stability value.

8. The method of claim 1 wherein the placement tool uses an annealing algorithm, and the first and second sets of input parameters have different annealing schedules.

9. The method of claim 1 wherein the placement tool uses a multi-level algorithm, and the first and second sets of input parameters have different random seeds for clustering.

10. The method of claim 1 wherein the placement tool uses a quadratic algorithm, and the first and second sets of input parameters have different stopping criteria.

11. A computer system comprising:
means for processing program instructions;
a memory device connected to said processing means; and
program instructions residing in said memory device for quantifying the stability of a placement tool used in mapping the physical layout of logic cells for an integrated circuit chip, wherein said program instructions design a first layout of logic cells using the placement tool based on a first set of input parameters, design a second layout of the logic cells using the placement tool based on a second set of input parameters which is different from the first set of input parameters, calculate a stability value based on the movement of respective cell locations from the first layout to the second layout, and normalize the stability value based on respective cell locations in a third layout which is a random placement of the logic cells.

12. The computer system of claim 11 wherein said program instructions measure absolute movement of individual logic cells.

13. The computer system of claim 12 wherein said program instructions weight cell movement by cell area in calculating the stability value.

14. The computer system of claim 12 wherein said program instructions square absolute cell movement in calculating the stability value.

15. The computer system of claim 11 wherein said program instructions measure relative movement of logic cells with respect to the one or more nets of the layouts.

16. The computer system of claim 15 wherein shifting of logic cells and symmetric reversal of logic cells about a net center does not contribute to the relative movement, but spreading of logic cells and rotation of logic cells with respect to the net center does contribute to the relative movement.

17. The computer system of claim 15 wherein said program instructions square relative cell movement in calculating the stability value.

18. A computer program product comprising:
a computer-readable medium; and
program instructions residing in said medium for quantifying the stability of a placement tool used in mapping the physical layout of logic cells for an integrated circuit chip, wherein said program instructions design a first layout of logic cells using the placement tool based on a first set of input parameters, design a second layout of the logic cells using the placement tool based on a second set of input parameters which is different from the first set of input parameters, calculate a stability value based on the movement of respective cell locations from the first layout to the second layout, and normalize the stability value based on respective cell loations in a third layout which is a random placement of the logic cells.

19. The computer program product of claim 18 wherein said program instructions measure absolute movement of individual logic cells.

20. The computer program product of claim 19 wherein said program instructions weight cell movement by cell area in calculating the stability value.

21. The computer program product of claim 20 wherein said program instructions square absolute cell movement in calculating the stability value.

22. The computer program product of claim 18 wherein said program instructions measure relative movement of logic cells with respect to the one or more nets of the layouts.

23. The computer program product of claim 22 wherein shifting of logic cells and symmetric reversal of logic cells about a net center does not contribute to the relative movement, but spreading of logic cells and rotation of logic cells with respect to the net center does contribute to the relative movement.

24. The computer program product of claim 22 wherein said program instructions square relative cell movement in calculating the stability value.

25. A method of quantifying the stability of a placement tool used in mapping the physical layout of logic cells for an integrated circuit chip, comprising the steps of:
designing a first layout of logic cells using the placement tool based on a first set of input parameters;
designing a second layout of the logic cells using the placement tool based on a second set of input parameters which is different from the first set of input parameters; and
calculating a stability value based on the movement of respective cell locations from the first layout to the second layout, wherein said calculating step measures relative movement of logic cells with respect to the one or more nets of the layouts, and shifting of logic cells and symmetric reversal of logic cells about a net center does not contribute to the relative movement but spreading of logic cells and rotation of logic cells with respect to the net center does contribute to the relative movement.

26. A computer system comprising:
means for processing program instructions;
a memory device connected to said processing means; and
program instructions residing in said memory device for quantifying the stability of a placement tool used in mapping the physical layout of logic cells for an integrated circuit chip, wherein said program instructions design a first layout of logic cells using the placement tool based on a first set of input parameters, design a second layout of the logic cells using the placement tool based on a second set of input parameters which is different from the first set of input parameters, and calculate a stability value based on the movement of respective cell locations from the first layout to the second layout, wherein relative movement of logic cells is measured with respect to the one or more nets of the layouts, and shifting of logic cells and symmetric reversal of logic cells about a net center does not contribute to the relative movement but spreading of logic cells and rotation of logic cells with respect to the net center does contribute to the relative movement.

27. A computer program product comprising:
a computer-readable medium; and
program instructions residing in said medium for quantifying the stability of a placement tool used in mapping the physical layout of logic cells for an integrated circuit chip, wherein said program instructions design a first layout of logic cells using the placement tool based on a first set of input parameters, design a second layout of the logic cells using the placement tool based on a second set of input parameters which is different from the first set of input parameters, and calculate a stability value based on the movement of respective cell locations from the first layout to the second layout, wherein relative movement of logic cells is measured with respect to the one or more nets of the layouts, and shifting of logic cells and symmetric reversal of logic cells about a net center does not contribute to the relative movement but spreading of logic cells and rotation of logic cells with respect to the net center does contribute to the relative movement.

* * * * *